(12) United States Patent
Ito et al.

(10) Patent No.: US 7,974,067 B2
(45) Date of Patent: Jul. 5, 2011

(54) PLASMA PROCESSING APPARATUS AND METHOD OF SUPPRESSING ABNORMAL DISCHARGE THEREIN

(75) Inventors: Natsuko Ito, Kanagawa (JP); Mitsuo Yasaka, Kumamoto (JP); Fumihiko Uesugi, Kanagawa (JP); Yousuke Itagaki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 37 days.

(21) Appl. No.: 11/514,267

(22) Filed: Sep. 1, 2006

(65) Prior Publication Data

US 2007/0058322 A1  Mar. 15, 2007

(30) Foreign Application Priority Data

Sep. 6, 2005 (JP) ................................ 2005-258157

(51) Int. Cl.
*H01L 21/683* (2006.01)
(52) U.S. Cl. ...................................... 361/234
(58) Field of Classification Search .................. 361/234
See application file for complete search history.

(56) References Cited

U.S. PATENT DOCUMENTS

| | | | | |
|---|---|---|---|---|
| 5,460,684 A * | 10/1995 | Saeki et al. | ............... | 156/345.51 |
| 5,557,215 A * | 9/1996 | Saeki et al. | ................... | 324/765 |
| 5,790,365 A * | 8/1998 | Shel | ............... | 361/234 |
| 6,228,278 B1 * | 5/2001 | Winniczek et al. | ............. | 216/61 |
| 6,304,424 B1 * | 10/2001 | Mett et al. | ..................... | 361/234 |
| 6,447,691 B1 * | 9/2002 | Denda et al. | .................... | 216/61 |
| 6,790,375 B1 * | 9/2004 | Howald et al. | .................. | 216/67 |
| 2003/0178140 A1 * | 9/2003 | Hanazaki et al. | ........ | 156/345.28 |
| 2005/0194094 A1 | 9/2005 | Yasaka | | |
| 2007/0035908 A1 * | 2/2007 | Kitsunai et al. | ............... | 361/234 |

FOREIGN PATENT DOCUMENTS

| | | |
|---|---|---|
| JP | 6-232089 A | 8/1994 |
| JP | 08-316297 A | 11/1996 |
| JP | 2002-252276 A | 9/2002 |
| JP | 2003173896 A | 6/2003 |
| JP | 2003173897 A | 6/2003 |
| JP | 2003-234332 A | 8/2003 |
| JP | 2003-282545 A | 10/2003 |
| JP | 2003-318115 A | 11/2003 |
| JP | 2006-210726 A | 8/2006 |
| JP | 2007-48986 A | 2/2007 |
| WO | 0174123 A1 | 10/2001 |

OTHER PUBLICATIONS

English translation of JP 2003-318115, Yakaka Mitsuo, Jul. 11, 2003, "Window Type Probe, Pasma Monitoring Apparatus, and Plasma Treatment Apparatus".*

* cited by examiner

*Primary Examiner* — Jared J Fureman
*Assistant Examiner* — Nicholas Ieva
(74) *Attorney, Agent, or Firm* — Sughrue Mion, PLLC

(57) ABSTRACT

In a plasma processing apparatus having an electrostatic chuck for holding a semiconductor wafer by an electrostatic adsorption force and a DC power supply for applying an electrostatic adsorption voltage to the electrostatic chuck, abnormal discharge in plasma is suppressed by providing the apparatus with a signal detector that detects a foresee signal that foresees occurrence of abnormal discharge in plasma, and a controller that controls ESC leakage current based upon the foresee signal. If the foresee signal is outside a prescribed range, control is exercised so as to reduce the absolute value of the electrostatic adsorption voltage, thereby suppressing the occurrence of an abnormal discharge.

12 Claims, 8 Drawing Sheets

ESC VOLTAGE CONTROL ON

ESC VOLTAGE CONTROL OFF

PLASMA PROCESSING APPARATUS AND METHOD OF SUPPRESSING ABNORMAL DISCHARGE THEREIN

FIELD OF THE INVENTION

This invention relates to a plasma processing apparatus and to a method of suppressing abnormal discharge in this apparatus. More particularly, the invention relates to a processing apparatus in which a workpiece to be processed is held by an electrostatic chuck and the workpiece is processed using a high-frequency, high-voltage plasma discharge, and to a method of suppressing abnormal discharge produced in this processing apparatus.

BACKGROUND OF THE INVENTION

A plasma processing apparatus for processing the surface of a semiconductor substrate or the like using a plasma discharge is employed widely in the field of semiconductor manufacture. In a plasma processing apparatus, a workpiece to be processed such as a semiconductor substrate is subjected to plasma processing by producing a plasma across two electrodes (an electrode to which high-frequency power is applied and an opposing electrode to which a constant voltage is applied) provided inside a chamber. The application electrodes also are constituents of an electrostatic chuck (ESC) that holds the semiconductor substrate, etc., by an electrostatic adsorption force. More specifically, an insulating film comprising a dielectric is provided on a base serving also as an application electrode, and a workpiece such as a semiconductor substrate is placed on the film. Alternatively, an electrostatic chuck sheet in which an application electrode has been sealed in an insulating film is provided on a base and the workpiece such as a semiconductor substrate is placed on the sheet. By applying a high-voltage DC voltage to the application electrodes to cause polarization of the insulating film, static electricity is produced at the boundary with the workpiece and the workpiece is held on the base by the resulting electrostatic adsorption force (coulomb force).

In a plasma processing apparatus of this kind, it is known that local discharge (abnormal discharge) occurs at times in the plasma within the chamber. When abnormal discharge occurs, this causes damage to components in the chamber that performs the plasma discharge and a molten spray of particles attach themselves to the substrate and contaminate the same. Further, it is known that exfoliated flakes of a reaction product that has attached itself to chamber walls increases when an abnormal discharge occurs. The substrate to be processed is contaminated as a result. Furthermore, if abnormal discharge occurs on the substrate, damage to the substrate and to wiring on the substrate occurs. Thus, abnormal discharge produced in a plasma apparatus causes damage to the substrate to be processed and to apparatus itself.

Detecting abnormal discharge, therefore, is important in terms of plasma processing and several techniques for ascertaining abnormal discharge are known in the related art. For example, the specification of Patent Document 1 discloses a window-type probe having at least an electrically conductive support member provided with an opening at least in a portion of the surface thereof facing a plasma, and a dielectric member having a probe electrode in one side surface thereof disposed in the opening of the electrically conductive support member. The output end of the window-type probe is equipped with a voltage-waveform measurement unit for measuring a voltage waveform. An abnormal discharge in the plasma is detected by a change in the voltage waveform sensed by the voltage-waveform measurement unit.

Further, the specification of Patent Document 2 discloses an apparatus in which a plasma is generated in a processing chamber by a high-frequency power supply, whereby a semiconductor wafer placed in an electrostatic chuck is processed. This apparatus includes a current monitor that detects a DC current that is for actuating the electrostatic chuck, and a $V_{DC}$ monitor for detecting $V_{DC}$ level from a power supply line of a high-frequency power supply. Monitor signals from these monitors are compared by a detecting unit. Since the amount of fluctuation of each monitor signal differs depending upon the location at which abnormal discharge occurs, whether an abnormal discharge has occurred and, if so, the location thereof, can be detected by the comparison in the detection unit.

As a related technique, the specification of Patent Document 3 discloses an electrostatic adsorbing apparatus in which a workpiece to be processed is held by a desired electrostatic adsorption force and the electrostatic adsorption force can be maintained stably at a set value despite a fluctuation in a self-bias voltage. The electrostatic adsorbing apparatus forms an electric circuit in which an ammeter 144, a resistor (dielectric film) 132, a semiconductor wafer W, a plasma PR and an upper electrode 152 are connected serially between the output terminal of a variable DC power supply 146 and ground, as illustrated in FIG. 8. In order to measure the self-bias voltage, a leakage current iL that flows into the resistor 132 is detected by the ammeter 144 while the output voltage $V_0$ of the variable DC power supply 146 is varied. Furthermore, a controller 150 adjusts the output voltage $V_0$ of the variable DC power supply 146 in order to maintain the electrostatic adsorption force despite fluctuations in the self-bias voltage.

[Patent Document 1] Japanese Patent Kokai Publication No. JP-P2003-318115A (FIG. 1)
[Patent Document 2] Japanese Patent Kokai Publication No. JP-A-6-232089 (FIG. 1)
[Patent Document 3] Japanese Patent Kokai Publication No. JP-P2002-252276A (FIG. 2)

SUMMARY OF THE DISCLOSURE

The entire disclosures of the Patent Documents mentioned above are incorporated herein with reference thereto.

Abnormal discharge of plasma in a plasma processing apparatus occurs sporadically owing to accumulation of electric charge inside the apparatus or a sudden increase or in partial potential difference. Accordingly, even if abnormal discharge of plasma is detected by the techniques disclosed in Patent Documents 1 and 2, contaminants will already have become attached to the workpiece owing to the abnormal discharge and the workpiece itself may be destroyed. This makes it necessary to temporarily suspend the manufacturing process and replace the defective workpiece. This can lead to an increase in the cost of manufacture. Thus, there is much to be desired in the art.

A technique for suppressing the occurrence of abnormal discharge is sought in order to solve the problems cited above. The inventor has conducted extensive studies with a view to foreseeing the occurrence of abnormal discharge. As a result, the inventor has focused on certain changes as signs foretelling of the occurrence of abnormal discharge, these being a change in the surface potential of an insulating transparent window provided in the chamber wall of the plasma processing apparatus, or a change in leakage current that flows from the DC power supply to the electrostatic chuck, and has discovered that it is possible to foresee the occurrence of abnormal discharge by observing these signal changes.

The signs that foretell of the occurrence of abnormal discharge will be described next. It is known that when an abnormal discharge occurs in plasma, an acoustic emission (AE) of supersonic wave is produced by the discharge and the acoustic emission produced propagates through the chamber of the plasma processing apparatus. By utilizing this fact, mounting an ultrasonic sensor to the chamber and detecting the acoustic emission that propagates through the chamber, the occurrence of abnormal discharge can be detected. Further, a window-type probe of the kind described in Patent Document 1 for recognizing a change in the surface potential of the insulating transparent window is mounted to the chamber and the signal from the window-type probe is observed. Furthermore, leakage current (ESC leakage current) that flows into the electrostatic chuck from the DC power supply is observed.

FIG. 1 is a diagram illustrating an example of the result of observing the above-mentioned signals. As shown in FIG. 1, an AE (acoustic emission) sensor signal indicates a sudden change at timings P1, P2, P3 and P4 and shows that an abnormal discharge in plasma has occurred at these timings. At a timing Q1 that is several hundred milliseconds earlier than timing P1, a sharp rise in ESC leakage current is observed. At a timing R1 identical with timing Q1, a sharp rise in the signal from the window-type probe also is observed. On the basis of these observations, the inventor has hypothesized that the ESC leakage current does not flow after the occurrence of abnormal discharge but that the abnormal discharge occurs because the ESC leakage current flows. In view of these facts, it is possible to foresee the occurrence of abnormal discharge by detecting a large fluctuation in the signal from the window-type probe or a large fluctuation in the ESC leakage current. The present invention has been devised upon confirming that it is possible to suppress abnormal discharge in plasma if control is exercised so as to diminish the absolute value of the electrostatic adsorption voltage in the electrostatic chuck based upon such a predictive or "foresee" signal.

A plasma processing apparatus according to one aspect of the present invention is for processing a workpiece by plasma generated by high-frequency power. The apparatus comprises an electrostatic chuck for holding the workpiece by an electrostatic adsorption force; a DC power supply for applying an electrostatic adsorption voltage to the electrostatic chuck; a signal detector for detecting a foresee signal that foresees occurrence of abnormal discharge in plasma; and a controller for controlling ESC leakage current based upon the foresee signal.

A method of suppressing abnormal discharge in a plasma processing apparatus according to another aspect of the present invention is a method of suppressing abnormal discharge in plasma processing by a plasma processing apparatus for processing a workpiece by plasma generated by high-frequency power, the method comprising the steps of: applying an electrostatic adsorption voltage, which is supplied from a DC power supply, to an electrostatic chuck that holds a workpiece by an electrostatic adsorption force; detecting a foresee signal that foresees occurrence of abnormal discharge in plasma; and controlling ESC leakage current based upon the foresee signal.

The meritorious effects of the present invention are summarized as follows.

In accordance with the present invention, the occurrence of abnormal discharge in plasma can be suppressed by controlling plasma based upon a detected foresee signal. Control of the plasma can be carried out by controlling a voltage for electrostatic adsorption, as a result of which abnormal discharge can be suppressed before it occurs. Alternatively, ESC leakage current can be suppressed also by controlling high-frequency power, thereby enabling abnormal discharge to be suppressed before it occurs. Accordingly, since the occurrence of abnormal discharge can be prevented proactively, the number of times a defective workpiece is replaced, etc., in manufacture by plasma processing is reduced and an increase in the cost of manufacture can be reduced.

Other features and advantages of the present invention will be apparent in the entire disclosure, particularly from the following description taken in conjunction with the accompanying drawings, in which like reference characters designate the same or similar parts throughout the figures thereof.

PREFERRED EMBODIMENTS OF THE INVENTION

Figure 1:
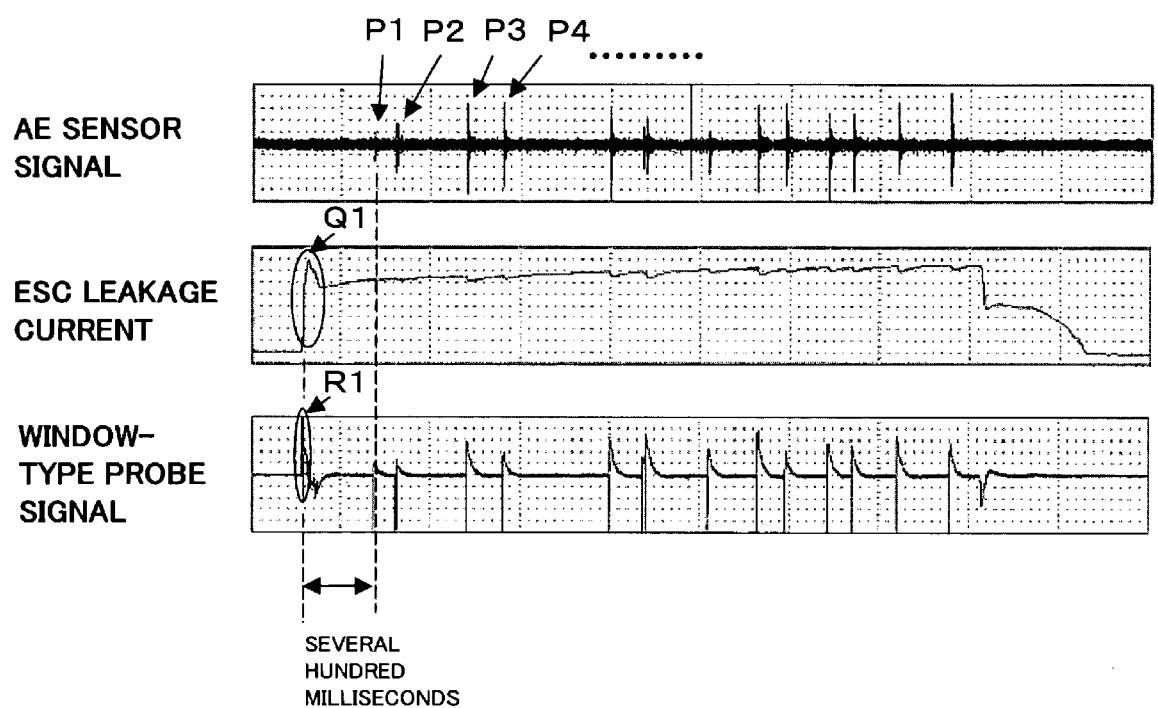
FIG. 1 is a diagram illustrating the waveforms of foresee signals for recognizing the occurrence of abnormal discharge in advance.

Preferred embodiments of the present invention will now be described in detail.

A plasma processing apparatus according to the present invention processes a workpiece to be processed, such as a semiconductor substrate, by plasma generated by high-frequency power. The plasma processing apparatus comprises an electrostatic chuck that holds the workpiece by an electrostatic adsorption force; a DC power supply that applies an electrostatic adsorption voltage to the electrostatic chuck; a signal detector that detects a foresee signal that foresees occurrence of abnormal discharge in plasma; and a controller (control unit) that controls ESC leakage current based upon the foresee signal. More specifically, the controller corresponds to a controller that reduces the absolute value of the electrostatic adsorption voltage or to a controller that exercises control so as to reduce high-frequency power. The signal detector corresponds to a window-potential detector for detecting the surface potential of an insulating transparent window provided in/on a chamber wall of the plasma processing apparatus, or a current detector for detecting leakage current that flows from the DC power supply to the electrostatic chuck.

The plasma processing apparatus thus constructed applies an electrostatic adsorption voltage, which is supplied from the DC power supply, to the electrostatic chuck, and a workpiece to be processed is held by the electrostatic chuck using electrostatic adsorption force. The workpiece held is subjected to plasma processing. It is so arranged that a foresee signal is detected in the signal detector at such time. In a case where the foresee signal is outside (or exceeds) a prescribed range, control is exercised so as to reduce the absolute value of the electrostatic adsorption voltage. The occurrence of an abnormal discharge in plasma can be suppressed by reducing the absolute value of the electrostatic adsorption voltage. Certain period of time, e.g., a fixed period of time after control is applied to reduce the absolute value of the electrostatic adsorption voltage, control is exercised so as to restore the voltage that prevailed before the absolute value of the electrostatic adsorption voltage was reduced. Even though the absolute value of the electrostatic adsorption voltage is made small, it takes time for the electrostatic adsorption force (coulomb force) of the static electricity to vanish. Accordingly, if the electrostatic adsorption voltage is restored to the original voltage within a period of time the electrostatic adsorption force can still be maintained, then the electrostatic adsorption force will be maintained. As a result, plasma processing of the workpiece will continue in stable fashion.

Alternatively, in a case where the foresee signal is outside the prescribed range, control may be exercised so as to lower high-frequency power. Lowering high-frequency power enables suppression of the occurrence of abnormal discharge in plasma. Further, certain (e.g., a fixed) period of time after control is applied to lower high-frequency power, control is exercised so as to restore the voltage that prevailed before the high-frequency power was lowered. As a result, plasma processing of the workpiece continues.

Since plasma processing is carried out while the plasma processing apparatus is operated as described above to suppress the occurrence of abnormal discharge in plasma, the number of times a defective workpiece is replaced, etc., in the manufacture by plasma processing is reduced and an increase in the cost of manufacture can be reduced.

Further, in accordance with the present invention, it is possible to suppress the occurrence of abnormal discharge in plasma with almost no change in the structure of the chamber of an already existing conventional plasma processing apparatus and without the need for a change in process conditions per se. Furthermore, if an electrostatic chuck is used, it is possible to apply the present invention in most varieties of plasma processing apparatus.

Embodiments of the invention will now be set forth.

First Embodiment

Figure 2:
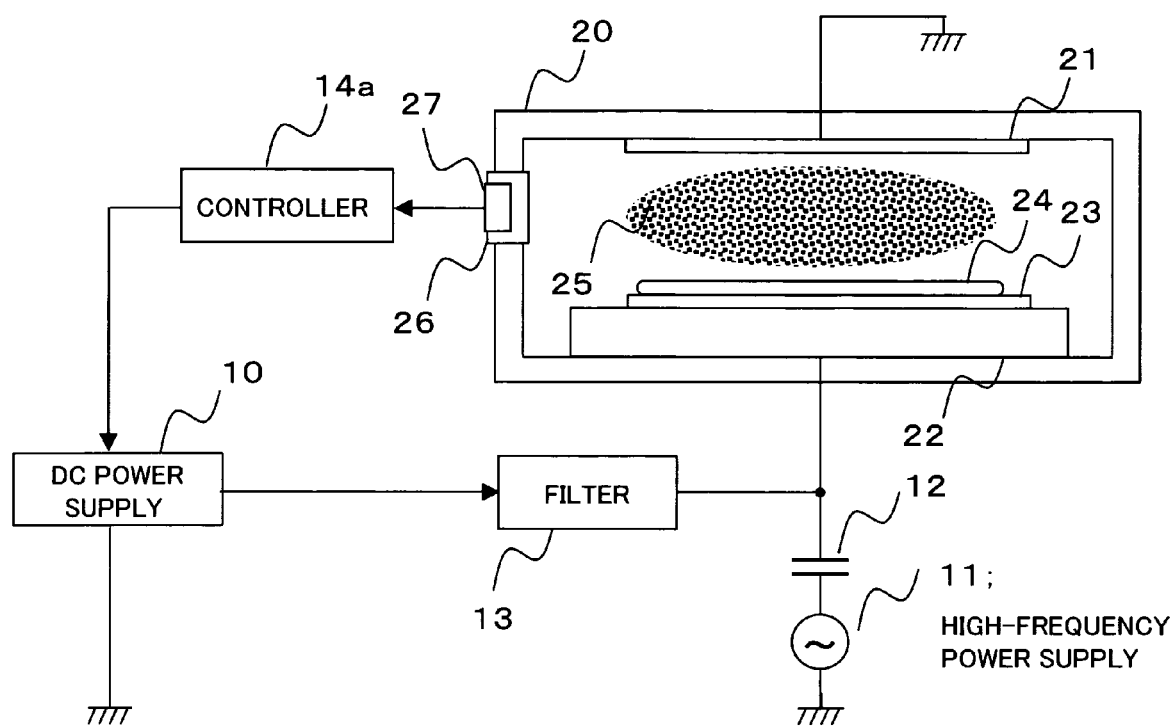
FIG. 2 is a block diagram illustrating the structure of a plasma processing apparatus according to a first embodiment of the present invention.

FIG. 2 is a block diagram illustrating the structure of a plasma processing apparatus according to a first embodiment of the present invention. As illustrated in FIG. 2, the plasma processing apparatus includes a DC power supply 10, a high-frequency power supply 11, a capacitor 12, a filter 13, a controller (control unit) 14a and a chamber 20. Further, the chamber 20 has an upper electrode 21, a lower electrode 22, an insulating film 23 and a window (view port) 26. A workpiece 24 to be processed, such as a semiconductor substrate, is placed on the insulating film 23.

The DC power supply 10 generates an electrostatic adsorption voltage of from several hundred to several thousand volts and supplies the voltage to the lower electrode 22 via the filter 13 as a high-voltage DC voltage (ESC potential). The lower electrode 22 is a constituent of an electrostatic chuck that holds the semiconductor substrate, etc., by electrostatic adsorption force. Provided on the lower electrode 22 is the insulating film 23 serving also as a base and being made of a dielectric. The workpiece 24 to be processed, such as a semiconductor substrate, is placed on the insulating film 23. A high-voltage DC voltage is impressed across the lower electrode 22 and the upper electrode 21, which is disposed so as to oppose the lower electrode 22 and is grounded, thereby polarizing the insulating film 23 and generating static electricity at the boundary surface of the insulating film 23 and workpiece 24. Thus the workpiece 24 is held on the lower electrode 22 serving as the base by the electrostatic adsorption force (coulomb force) of the static electricity.

Although not illustrated, the electrostatic chuck may consist of a electrostatic chuck sheet in which the lower electrode 22 is sealed in the form of a sheet within an insulating film. The electrostatic chuck sheet is provided on a base and the workpiece to be processed, such as a semiconductor substrate, is placed on the sheet.

The high-frequency power supply 11 generates a high-frequency power signal and supplies the signal to the lower electrode 22 via the capacitor 12. A plasma 25 is formed between the upper electrode 21 and lower electrode 22 by the high-frequency power supplied. The workpiece 24 is subjected to plasma processing by the plasma 25 formed.

The filter 13 functions to block the high-frequency power signal in such a manner that the high-frequency power signal generated by the high-frequency power supply 11 will not flow into the DC power supply 10. Further, the capacitor 12 functions to block the electrostatic adsorption voltage in such a manner that the electrostatic adsorption voltage generated by the DC power supply 10 will not act directly upon the high-frequency power supply 11.

The view port 26 is a window made of quartz or the like and is mounted in the chamber 20 in order that the state of the plasma 25 within the chamber 20 may be observed. The view port 26 is provided with a window-type probe; namely a window-potential detector 27 that detects the surface potential (potential of the window-type probe) of the insulating transparent window. The window-potential detector 27 detects an abnormal discharge in the plasma 25. In particular, as illustrated in FIG. 1, the detector 27 recognizes, in advance, the signs that foretell of the occurrence of abnormal discharge and outputs a window probe potential serving as a foresee signal.

The controller 14a determines whether the potential of an output of the window-type probe is within a prescribed range. If the potential is outside (or exceeds) the prescribed range, then the controller 14a controls the DC power supply 10 so as to diminish the absolute value of the electrostatic adsorption voltage produced by the DC power supply 10. Further, in a case where the absolute value of the electrostatic adsorption voltage has been reduced, the controller 14a exercises control in such a manner that upon elapse of certain (e.g., a fixed) period of time, the voltage that prevailed before the reduction of the absolute value is restored. The self-bias potential of the wafer is usually negative. When the electrostatic adsorption voltage is positive, therefore, the electrostatic adsorption voltage is lowered and made to approach to zero in order to diminish the potential difference. Conversely, when the electrostatic adsorption voltage is negative, the electrostatic adsorption voltage is raised and made to approach zero in order to diminish the potential difference. It should be noted that in order to assure that the workpiece 24 will not separate from the base, certain (or fixed) period of time mentioned above preferably is less than the time it takes for the electrostatic adsorption force to decline, usually a few seconds or less.

Figure 3:
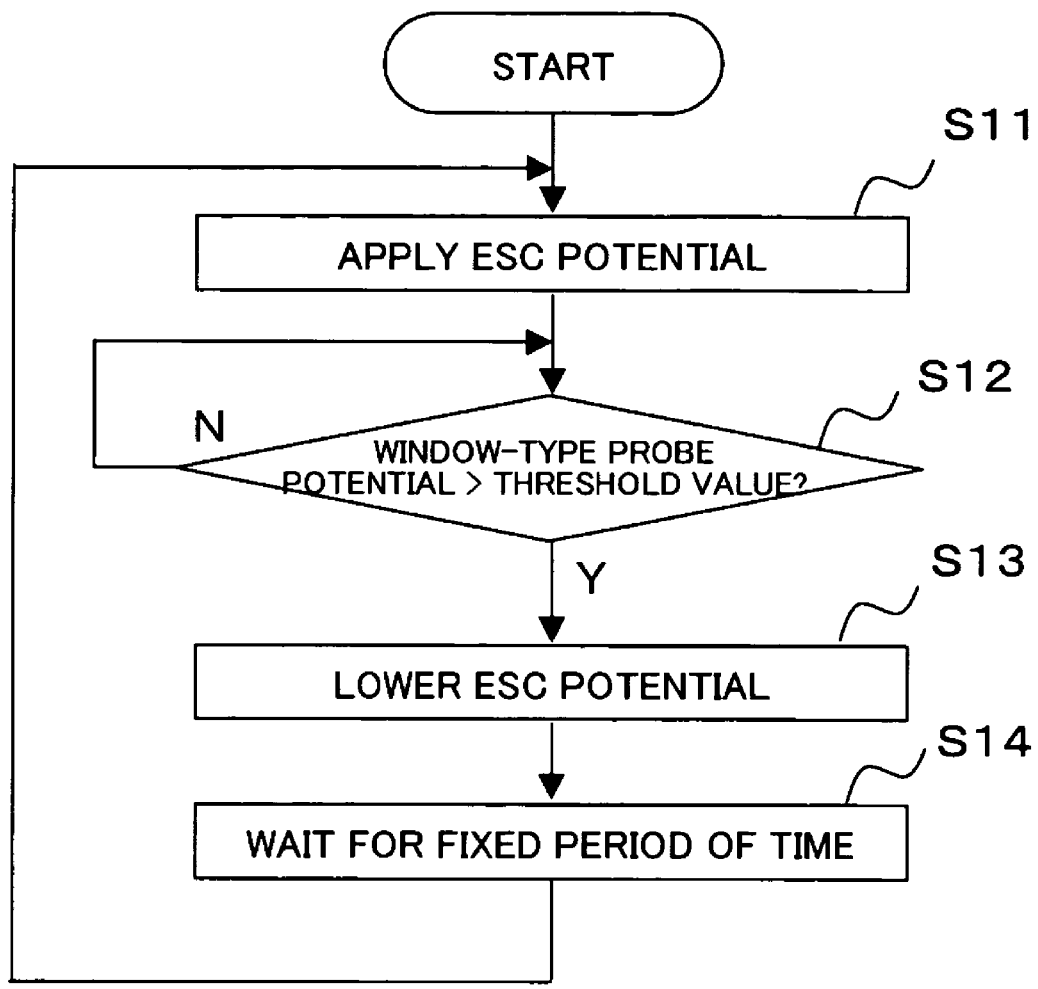
FIG. 3 is a flowchart illustrating the operation of the plasma processing apparatus according to the first embodiment.

The operation of the plasma processing apparatus will be described next. FIG. 3 is a flowchart illustrating the operation of the plasma processing apparatus.

At step S11 in FIG. 3, the DC power supply 10 applies the ESC potential to the lower electrode 22.

Next, at step S12, the controller 14a determines whether the window-type probe potential (signal) output by the window-potential detector 27 has exceeded a prescribed threshold value. If the threshold value is not exceeded ("NO" at step S12), then processing remains at step S12; if the threshold value is exceeded ("YES" at step S12) the control proceeds to step S13.

Next, at step S13, the controller 14a controls the DC power supply 10 so as to diminish the absolute value of the electrostatic adsorption voltage generated by the DC power supply 10.

This is followed by step S14, at which the controller 14a waits for a fixed period of time. At elapse of the fixed period of time, control returns to step S12 in order that the controller 14a may control the DC power supply 10 so as to restore the voltage that prevailed before the absolute value was reduced. The fixed period of time may be determined by preliminary experimental measurements.

Thus, the plasma processing apparatus operates, predicts the occurrence of abnormal discharge in plasma and controls the electrostatic adsorption voltage to thereby suppress the occurrence of abnormal discharge in plasma. That is, the hypothesis that the ESC leakage current does not flow after the occurrence of abnormal discharge but that the abnormal discharge in plasma occurs because the ESC leakage current flows is correct, and it has been demonstrated that the abnormal discharge in plasma can be suppressed by controlling the ESC leakage current.

Second Embodiment

Figure 4:
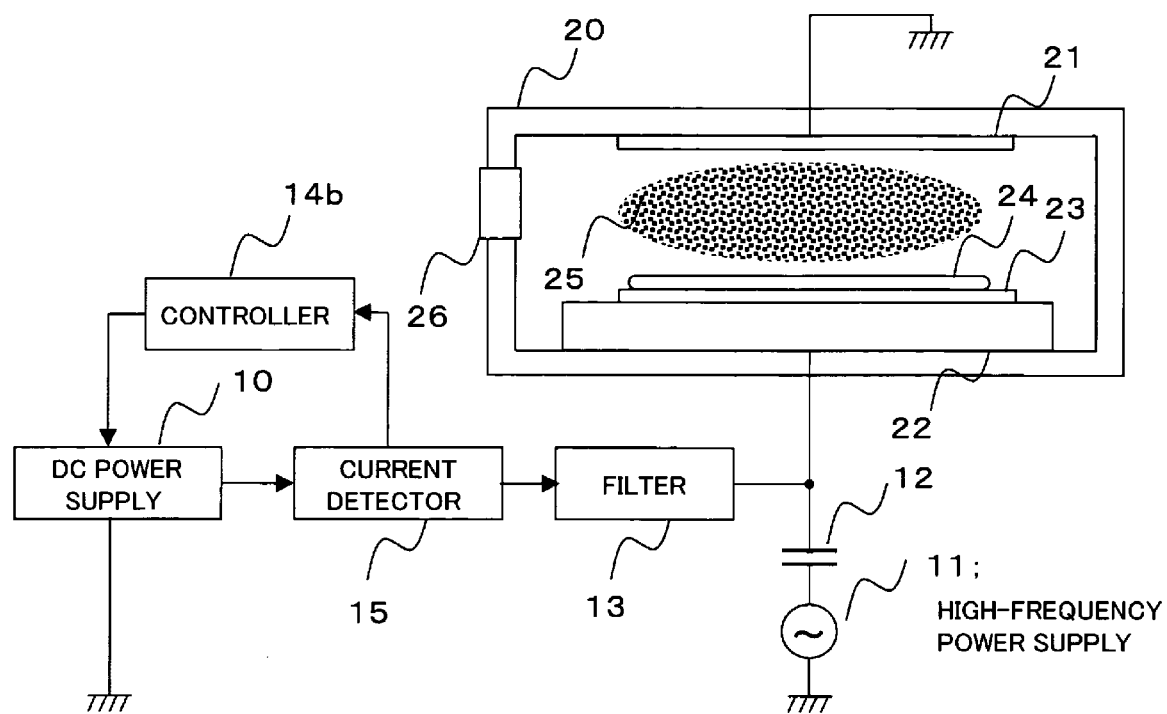
FIG. 4 is a block diagram illustrating the structure of a plasma processing apparatus according to a second embodiment of the present invention.

FIG. 4 is a block diagram illustrating the structure of a plasma processing apparatus according to a second embodiment of the present invention. Components in FIG. 4 identical with those shown in FIG. 2 are designated by like reference characters and need not be described again. The plasma processing apparatus of FIG. 4 has a controller 14b and a current detector 15 instead of the controller 14a and window-potential detector 27, respectively, of the embodiment in FIG. 2. Abnormal discharge is foreseen based on a deleted signal of the current detector 15.

The current detector 15 is inserted between the DC power supply 10 and the filter 13 and detects the current (ESC current) supplied from the DC power supply 10 to the lower electrode 22. The controller 14b determines whether the ESC current lies within a prescribed range and, if the ESC current is outside the prescribed range, controls the DC power supply 10 so as to diminish the absolute value of the electrostatic adsorption voltage generated by the DC power supply 10. Further, upon elapse of a predetermined period of time following the reduction in the absolute value of the electrostatic adsorption voltage, the controller 14b exercises control so as to restore the voltage that prevailed before it was lowered.

It should be noted that the operation of the plasma processing apparatus according to the second embodiment is equivalent to that of FIG. 3 except that at step S12 it is determined whether ESC current detected by the current detector 15, rather than the window probe potential that is output by the window-potential detector 27, has exceeded a prescribed threshold value.

Figure 5A:
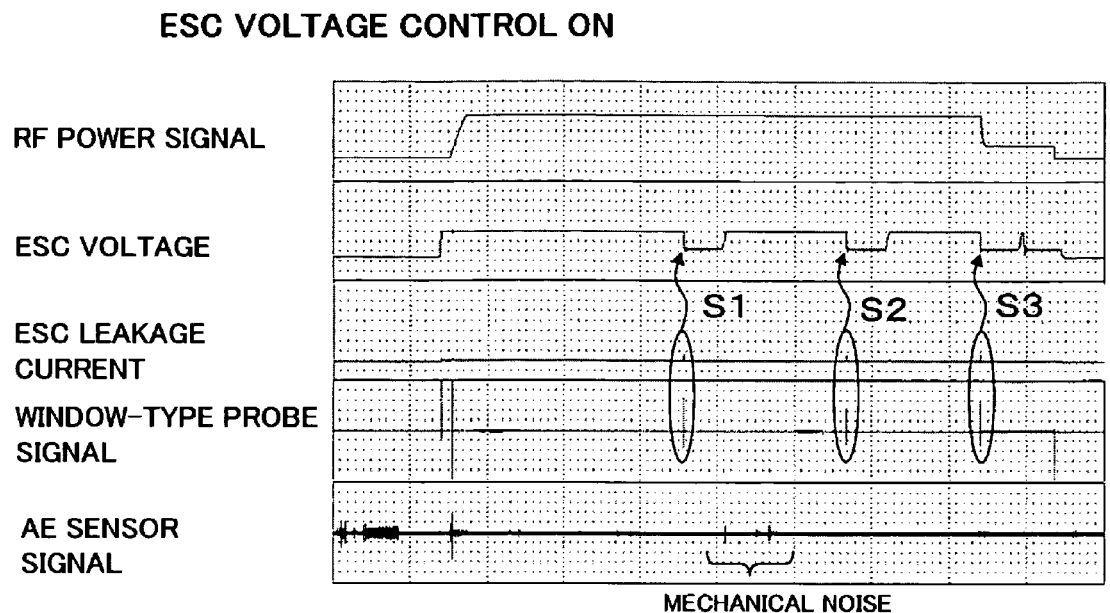
FIGS. 5A and 5B are diagrams illustrating the effects of suppressing abnormal discharge in a plasma processing apparatus.
Figure 5B:
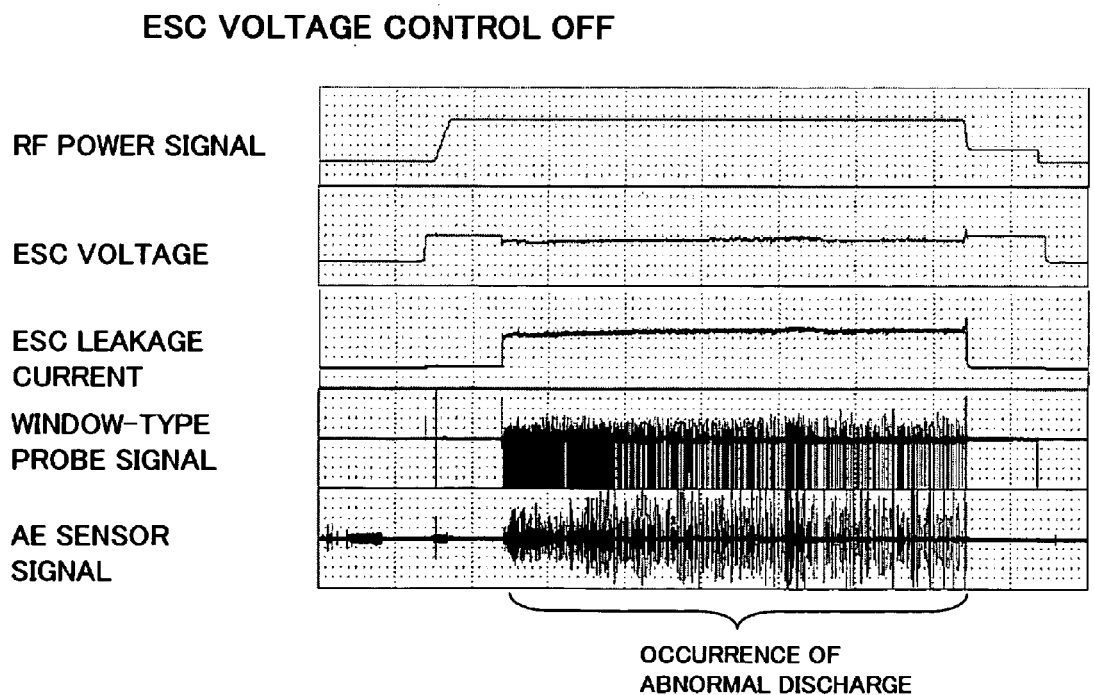

The effect of suppressing abnormal discharge in plasma will be described next. FIGS. 5A and 5B are diagrams illustrating the effects of suppressing abnormal discharge in the plasma processing apparatus. In FIGS. 5A and 5B, an RF power signal is a high-frequency power signal generated by the high-frequency power supply 11, ESC voltage is the electrostatic adsorption voltage generated by the DC power supply 10, ESC leakage current is the current supplied from the DC power supply 10 to the lower electrode 22, a window-type probe signal is the signal detected by the window-potential detector 27, and an AE sensor signal is a signal detected by an ultrasonic sensor mounted in the chamber.

FIG. 5A illustrates the waveforms of each of the signals that prevail when the electrostatic adsorption voltage generated by the DC power supply 10 is controlled by the controller 14a or 14b. FIG. 5B illustrates the waveforms of each of the signals that prevail when the electrostatic adsorption voltage generated by the DC power supply 10 is not controlled by either controller 14a or controller 14b.

As shown in FIG. 5A, sharp changes in the ESC leakage signal or window-type probe signal are captured at timings S1, S2 and S3, and control is exercised so as to lower the ESC voltage. By thus controlling the ESC voltage, the occurrence of abnormal discharge in plasma is suppressed. That is, FIG. 5A indicates that a large fluctuation does not occur in the AE sensor signal.

On the other hand, in a case where the electrostatic adsorption voltage generated by the DC power supply 10 is not controlled by either the controller 14a or the controller 14b, abnormal discharge occurs, as illustrated in FIG. 5B. Consequently, the AE sensor signal fluctuates greatly and so does the window-type probe signal. In addition, a large ESC leakage current flows owing to the abnormal discharge.

Thus, the foregoing indicates that if a sharp change in the ESC leakage current or window-type probe signal is recognized and control is exercised so as to lower the ESC voltage, a large abnormal-discharge suppression effect in plasma is obtained.

In the description rendered above, it may be so arranged that control is exercised to reduce the absolute value of the electrostatic adsorption voltage when both the signal representing the ESC leakage current and the window-type probe signal exceed respective threshold values.

Third Embodiment

Figure 6:
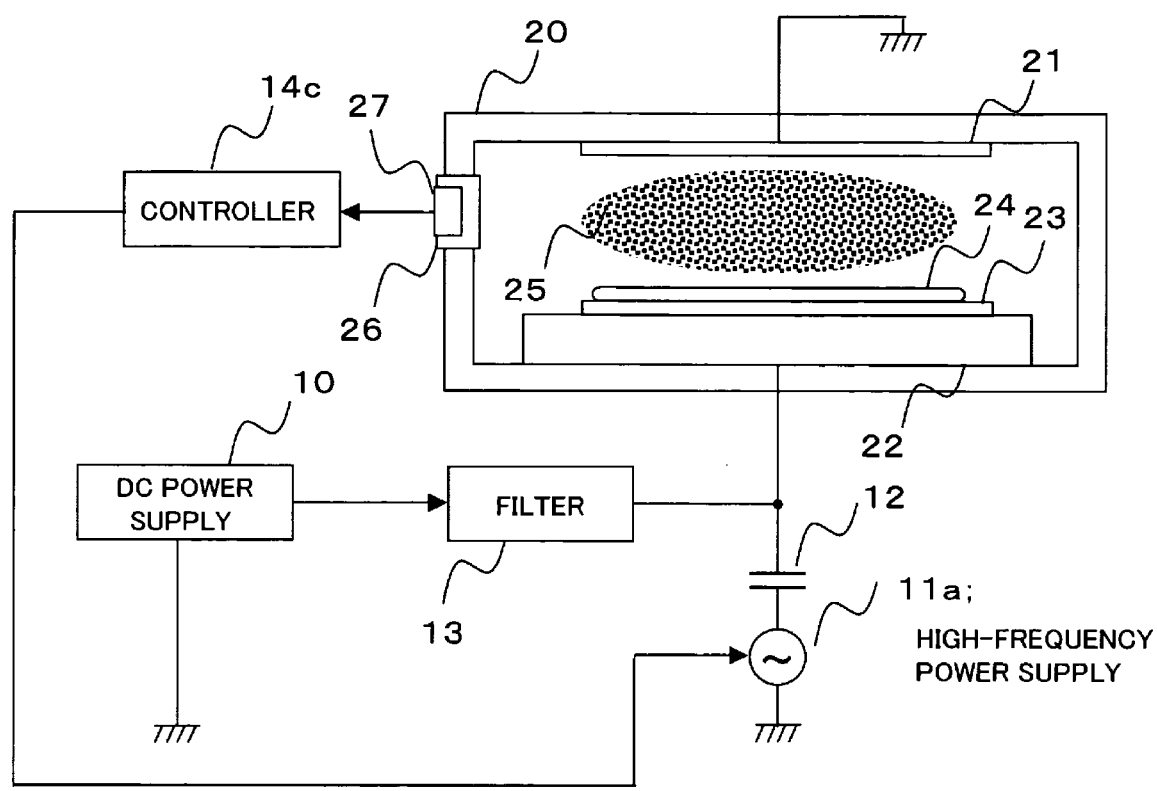
FIG. 6 is a block diagram illustrating the structure of a plasma processing apparatus according to a third embodiment of the present invention.

FIG. 6 is a block diagram illustrating the structure of a plasma processing apparatus according to a third embodiment of the present invention. Components in FIG. 6 identical with those shown in FIG. 2 are designated by like reference characters and need not be described again. The plasma processing apparatus of FIG. 6 has a controller 14c instead of the controller 14a of the embodiment in FIG. 2. On the basis of a foresee signal in the controller 14c, the high-frequency power that is output by a high-frequency power supply 11a is controlled. More specifically, control is exercised so as to lower the high-frequency power in order to suppress abnormal discharge. In other words, lowering the high-frequency power also is equivalent to exercising control so as to reduce the absolute value of the electrostatic adsorption voltage, in the sense that the ESC leakage current is controlled. Accordingly, by exercising control so as to reduce high-frequency power when the signal representing the ESC leakage current or the window-type probe signal exceeds the respective threshold value, or when both of these foresee signals exceed their respective threshold values, the occurrence of abnormal discharge in plasma can be suppressed. However, if high-frequency power is reduced too much, it is possible that the state of plasma processing of the workpiece may change. For this reason, it is preferred that the amount of the reduction be held within a range that will assure the stability of plasma processing. Furthermore, upon elapse of a fixed period of time following control to lower high-frequency power, control is exercised so as to restore the voltage that prevailed before high-frequency power was lowered.

Figure 7:
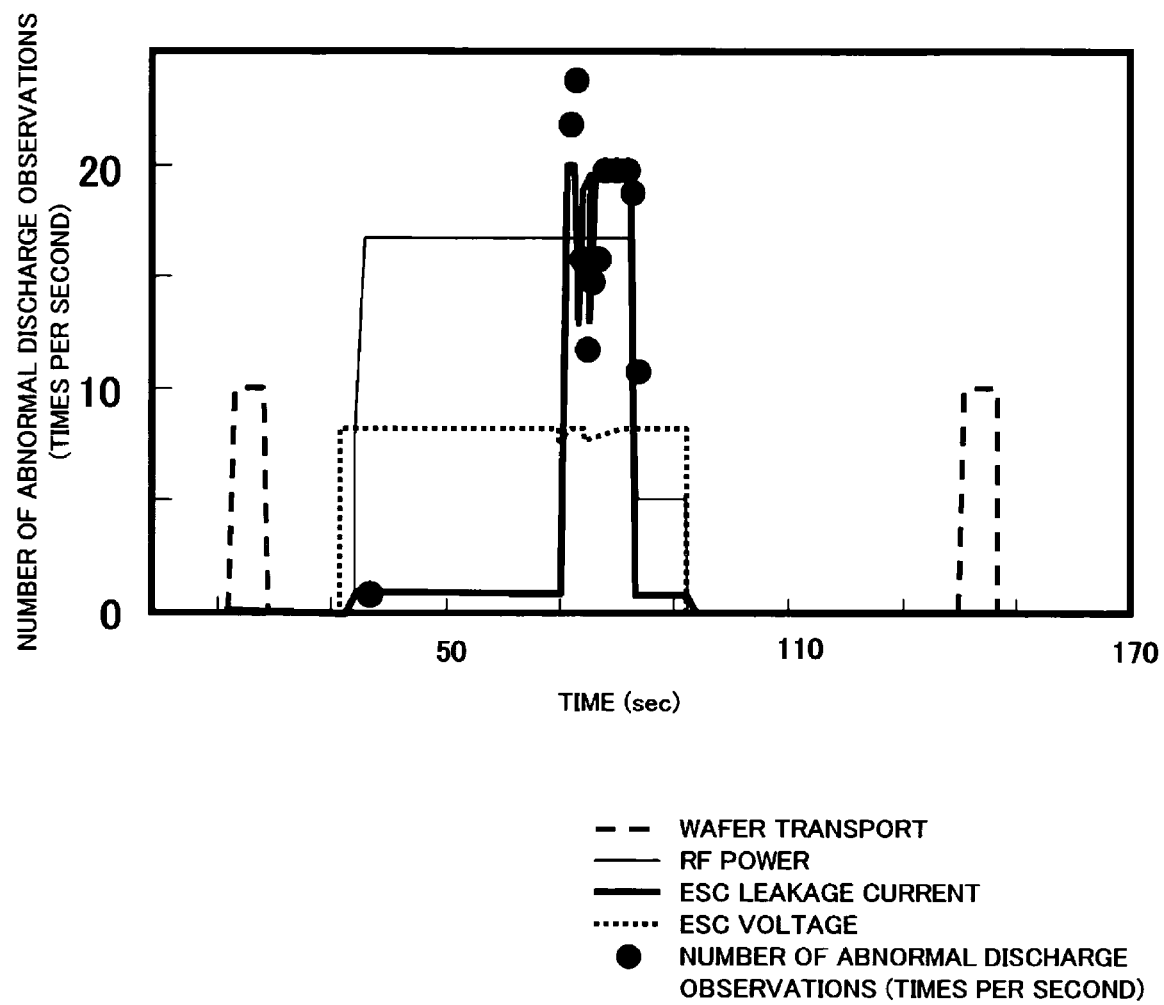
FIG. 7 is a diagram illustrating the principle involved in achieving the effectiveness in suppressing abnormal discharge according to the third embodiment.
Figure 8:
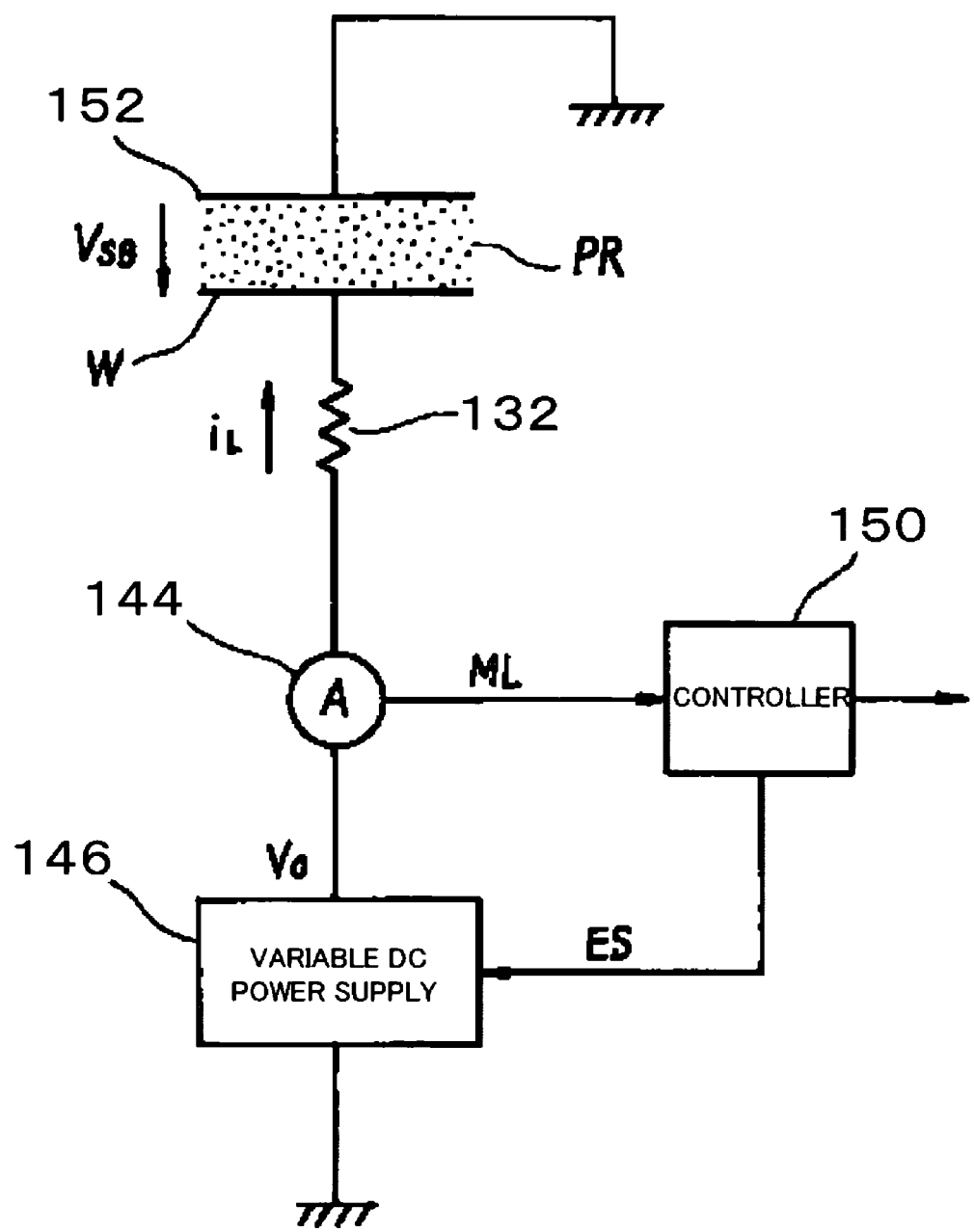
FIG. 8 is a block diagram illustrating the structure of a plasma processing apparatus according to the prior art.

FIG. 7 is a diagram illustrating the principle involved in achieving the effectiveness in suppressing abnormal discharge according to the third embodiment. FIG. 7 illustrates an example of one plasma processing cycle that includes conveyance (transport) of a wafer into the chamber, application of plasma processing and conveyance of the wafer from the interior to the exterior of the chamber. Time along the horizontal axis indicates relative timing in this example. After application of ESC voltage in the vicinity of 30 sec, high-frequency power (RF power) is applied and plasma processing of the wafer is carried out. RF power is lowered temporarily in the vicinity of 80 sec, processing for de-electrifying the wafer is performed and zero is subsequently obtained in the vicinity of 90 sec. It is observed that ESC leakage current starts rising when the ESC voltage is applied, RF power is then applied and the ESC leakage current attains a constant value. It will be understood that if the ESC leakage current increases suddenly for some reason in the vicinity of 70 sec, abnormal discharges will be observed immediately thereafter. In this case, it is observed that the ESC voltage is left uncontrolled and fluctuates owing to the influence of a sudden increase or decrease in ESC leakage current. Although abnormal discharges continue to be observed in a state where the ESC leakage current is large, when RF power is lowered in the vicinity of 80 sec, ESC leakage current also declines simultaneously and abnormal discharges are no longer observed. It will be appreciated from this fact that ESC leakage current is suppressed and an abnormal-discharge suppression effect is obtained also by lowering RF power.

In terms of the degree of influence upon the stability of plasma processing and machining precision of the workpiece by plasma processing, controlling the electrostatic adsorption voltage is better than controlling high-frequency power. Accordingly, it can be construed that controlling ESC leakage current by controlling the electrostatic adsorption voltage is more effective in suppressing abnormal discharge while assuring stability of plasma processing.

Though the present invention has been described in accordance with the foregoing embodiments, the invention is not limited to this embodiment and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A plasma processing apparatus for processing a workpiece by plasma generated by high-frequency power, comprising:
   an electrostatic chuck that holds the workpiece by an electrostatic adsorption force;
   a DC power supply that applies an electrostatic adsorption voltage to the electrostatic chuck;
   a signal detector that detects a foresee signal that foresees occurrence of abnormal discharge in plasma; and
   a controller that controls ESC leakage current based upon the foresee signal so as to suppress the occurrence of abnormal discharge,
   wherein said signal detector includes a window-potential detector that detects a surface potential of an insulating transparent window provided in a chamber wall of the plasma processing apparatus, and
   said foresee signal is detected by the signal detector as a characteristic of the detected surface potential.

2. The apparatus according to claim 1, wherein said controller controls the electrostatic adsorption voltage.

3. The apparatus according to claim 1, wherein said controller controls the high-frequency power.

4. The apparatus according to claim 3, wherein said controller exercises control so as to lower the high-frequency power if the foresee signal is outside a prescribed range.

5. A method of suppressing abnormal discharge in plasma processing, said method comprising:
   providing a plasma processing apparatus that processes a workpiece by plasma generated by high-frequency power;
   applying an electrostatic adsorption voltage, which is supplied from a DC power supply, to an electrostatic chuck that holds a workpiece by an electrostatic adsorption force;
   detecting a foresee signal that foresees occurrence of abnormal discharge in plasma; and
   controlling ESC leakage current based upon the foresee signal so as to suppress the occurrence of abnormal discharge,
   wherein said foresee signal is detected as a characteristic of a surface potential of an insulating transparent window provided in a chamber wall of the plasma processing apparatus.

6. A plasma processing apparatus for processing a workpiece by plasma generated by high-frequency power, comprising:
   an electrostatic chuck that holds the workpiece by an electrostatic adsorption force;
   a DC power supply that applies an electrostatic adsorption voltage to the electrostatic chuck;
   a signal detector that detects a foresee signal that foresees occurrence of abnormal discharge in plasma; and
   a controller that controls ESC leakage current based upon the foresee signal so as to suppress the occurrence of abnormal discharge,
   wherein said signal detector includes a current detector that detects leakage current flowing from said DC power supply to said electrostatic chuck, and
   said foresee signal is detected by the signal detector as a characteristic of the detected leakage current.

7. The apparatus according to claim 6, wherein said controller controls the electrostatic adsorption voltage.

8. The apparatus according to claim 6, wherein said controller controls the high-frequency power.

9. The apparatus according to claim 8, wherein said controller exercises control so as to lower the high-frequency power if the foresee signal is outside a prescribed range.

10. The apparatus according to claim 2, wherein said controller controls to decrease absolute value of the electrostatic absorption voltage when said surface potential of the window falls outside a predetermined range.

11. The apparatus according to claim 9, wherein said controller controls to decrease said high-frequency power followed by returning to the high-frequency power of a level of prior to the decrease thereof after elapse of a predetermined period of time.

12. The apparatus according to claim 11, wherein said controller controls the absolute value of the electrostatic absorption voltage so as to return the electrostatic absorption voltage to a level of prior to the decrease thereof after elapse of a predetermined period of time.

* * * * *